(12) United States Patent
Goundar

(10) Patent No.: US 6,849,561 B1
(45) Date of Patent: Feb. 1, 2005

(54) METHOD OF FORMING LOW-K FILMS

(75) Inventor: Kamal Kishore Goundar, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 10/643,200

(22) Filed: Aug. 18, 2003

(51) Int. Cl.$^7$ .................. H01L 21/31; H01L 21/469
(52) U.S. Cl. .................. 438/765; 438/687; 438/769
(58) Field of Search ................. 438/765, 687, 438/758, 769; 427/249.15, 255.15, 255.27

(56) References Cited

U.S. PATENT DOCUMENTS

| | | | | |
|---|---|---|---|---|
| 4,670,299 A | * | 6/1987 | Fukuyama et al. | |
| 5,800,878 A | * | 9/1998 | Yao | |
| 6,589,888 B2 | * | 7/2003 | Nemani et al. | 438/778 |
| 6,668,752 B2 | * | 12/2003 | Yao | 118/723 E |
| 2001/0030369 A1 | * | 10/2001 | MacNeil et al. | |
| 2001/0031563 A1 | * | 10/2001 | Shioya et al. | |
| 2001/0051445 A1 | * | 12/2001 | Shioya et al. | |
| 2002/0027286 A1 | * | 3/2002 | Sundararajan et al. | |
| 2003/0129827 A1 | * | 7/2003 | Lee et al. | 438/629 |
| 2004/0126929 A1 | * | 7/2004 | Tang et al. | 438/118 |

FOREIGN PATENT DOCUMENTS

JP    2001-060584    * 3/2001

* cited by examiner

*Primary Examiner*—Caridad Everhart
(74) *Attorney, Agent, or Firm*—Knobbe Martens Olosn & Bear, LLP

(57) ABSTRACT

To deposit silicon carbide into a substrate, there is introduced into a reaction zone a gas including source gas of silicon, carbon, oxygen and an inert gas. An electric field is generated using low and high frequency RF power to produce a plasma discharge in the reaction zone to cause the deposition.

33 Claims, 7 Drawing Sheets

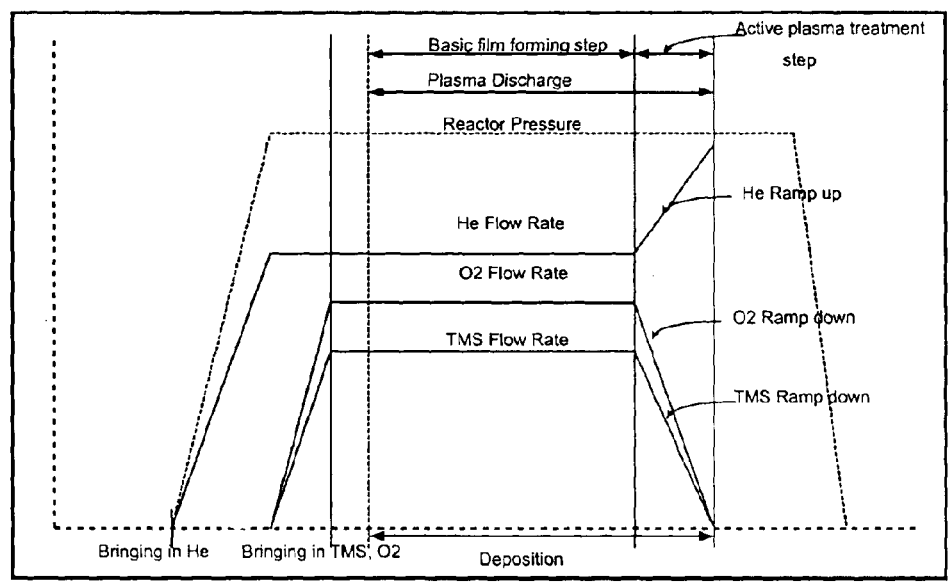
FIG.3, SiCO Film forming sequence, outline of deposition recipe.

METHOD OF FORMING LOW-K FILMS

FIELD OF THE INVENTION

The present invention relates to oxygen doped silicon carbide layers referred to herein as SiCO and, more particularly to a method of forming low dielectric constant, low leakage current with high elastic modulus and hardness oxygen doped silicon carbide layers.

BACKGROUND OF THE INVENTION

Integrated circuits have evolved into complex devices that include multiple levels of metal layers to electrically interconnect discrete layers of semiconductor devices on a single semiconductor chip. Recently, with the evolution of higher integration and higher density of integrated circuit components, the demand for greater speed of the data transfer rate is required. For this reason, an insulating film having low leakage current, low dielectric constant with high elastic modulus and hardness, to give the small RC delay is employed.

As the device dimensions continuously shrink, the RC time delay of the interconnect system becomes one of the most important limitation factors to the integrated circuits performance. The RC delay is directly proportional to the resistivity of the metal and the dielectric constant of the dielectric. In order to minimize the signal propagation delay, it is inevitable to use low dielectric constant materials as the inter-layer and intra-layer dielectrics (ILD).

The initial approach for providing low-dielectric films was the doping of the silicon oxide material with the other components such as fluorine that reduces the dielectric constant but only to that of about 3.5 to 3.9. Since the fluorine doped silicon oxide films offer only a small decrease in the dielectric constant, other solutions having lower dielectric constant are required. Furthermore, the stability of the fluorine doped silicon oxygen films with regard to moisture is problematic.

In an approach for providing a silicon oxide layer having a planar surface, spin-on-glass composition have been prepared utilizing polyorganosilsesquioxanes as presented in U.S. Pat. No. 4,670,299. The advantages of this film is that it has low dielectric constant such as that of 2.6 to 3.0, and also maintain the higher mechanical strengths of silicon oxide type films.

However, it would be advantageous to have a final dielectric film that combines the advantage of a film formed from organic polysilicas such as polyorgansilsesquioxanes referred to herein as POQS with an even lower dielectric constant (k<2.5). The most likely method for achieving this result is to blend the POSQ with another substance with lower dielectric constant. A substance with lower dielectric constant is air (k=1). So, in order to achieve lower dielectric constants, porosity needs to be introduced into the POSQ material. However, the process of introducing porosity is complex and is slow.

Furthermore, to reduce the size of interconnection lines and vias is to change the wiring materials from the conventional aluminum (Al) to copper (Cu) wiring having low electric resistance. However, to produce a semiconductor device having multi-layered copper wiring, a low dielectric constant insulating layer is formed as the interlayer insulating film on the copper wiring.

The use of copper as the interconnect material has various problems. For example, copper is easily diffused into the low dielectric constant insulating film from the copper wiring, thus increasing the leakage current between the upper and lower wiring.

The use of silicon carbide films as copper diffusion barrier layers has been published in U.S. Pat. No. 5,800,878. The dielectric constant of this film is about 5, and in addition it is used as copper diffusion barrier layers for 130 nm-nodes Large Scale Integration (LSI) technologies where the dielectric constant of the interlayer dielectric film is 3.

For next generation, 100 nm/65 nm-nodes Ultra Large Scale Integration (ULSI) technologies, the reduction of interconnect capacitance is important for suppressing the signal delay as well as the power consumption. Interlayer dielectric films with dielectric constant less than 2.5 are used with copper damascene structures. To decrease the effective dielectric of fine pitched lines, further reduction in the dielectric constant is necessary not only for the inter layer dielectric film itself but also the supporting dielectric films such as hard mask, etch stop layers and copper diffusion barrier layers. However, the process is difficult.

The interface between copper and copper diffusion barrier layer is known to be the key point for the electro-migration reliability of copper interconnects. The interface between copper and the copper diffusion barrier layer is the dominant diffusion path. However, there is no report on the identification of the dominant path for copper interconnects. On the other hand, the interface can be not only the dominant path but also the electro-migration induced void nucleation site.

The strength of adhesion between copper and diffusion layer would affect the electro-migration induced void nucleation because electro-migration induced void nucleates when copper atom at the interface is stripped away from the diffusion layer. It is also suggested that in order to prevent the migration of metal atoms, the film has to have a stable film stress even after being directly exposed to air at room temperature of about 20 to 30° C. Furthermore, the leakage current and dielectric constant of such film at 1 MV/cm has to be less-than that of $1\times10^{-9}$ A/cm$^2$ and less than 3.5 respectively. SiCO films with dielectric constant less than 3.5 such that the leakage current at 1 MV/cm is less than $1\times10^{-9}$ A/cm$^2$ are suggested to be suitable to substitute for such films.

Using the silicon carbide film as an etch stop film was developed and presented in U.S. Pat No. 5,800,878. A dielectric constant of the silicon carbide film is approximately 5. Silicon carbide films are applied to LSI devices using copper wiring in combination with carbon-containing silicon oxide films, whose dielectric constant is approximately 3. There are several different types of compositions for what is generally called silicon carbide films. One type is a silicon carbide film comprising Si, C and H. This film's stress and dielectric constant changes if left in the atmosphere. This is due to the oxidation of the top surface of the silicon carbide film. The method to minimize the oxidation of carbon containing materials, such as silicon carbide, with an inert gas plasma such as helium (He), Argon (Ar) is published in JP laid-open patent 2001/0060584. This inert gas plasma treatment only minimizes the top surface of the silicon carbide film from getting oxidized, however, no changes/improvements to the film properties are observed.

The method of forming nitrogen doped silicon carbide (SiCN), oxygen doped silicon carbides (SiCO) has been published in United States Patent Application Publication 2001/0030369, United States Patent Application Publication 2002/0027286, United States Patent Application Publication 2001/0051445, and United States Patent Application Publication 2001/0031563. Furthermore, these films have been proposed as copper diffusion barrier layers. Though a nitrogen doped silicon carbide layer has been proposed as a copper diffusion barrier layer with low leakage current, its dielectric constant is high such as 5.

Therefore, there is a need for a low dielectric constant film which also supports the copper diffusion barrier layers properties and is useful for the fabrication of IC devices, where the film is mechanically strong, useful at high temperatures, and is easily and quickly fabricated.

SUMMARY OF THE INVENTION

Thus, it is desired to develop a new method of forming low dielectric constant layers supporting copper diffusion barrier layers properties that can be employed in the next generation, 100 nm/65 nm-nodes Ultra Large Scale Integration (ULSI) technologies, where the copper damascene structures are used.

The main characteristics of low-k dielectric layer and copper diffusion barrier layers such as oxygen doped silicon carbide films (SiCO) developed using various embodiments of the present invention are as follows:

a) The dielectric constant is less than 3.0 b) No changes to its film properties such as changes to the film stress or changes to film dielectric constant are observed even when directly exposed to air at a room temperature between 20° C. to 30° C.

c) The leakage current at 1 MV/cm is extremely low, such as less than $5 \times 10^{-9}$ A/cm$^2$.

d) The elastic modulus and hardness are above 10 G Pa and 2 G Pa respectively.

According to one preferred embodiment of the present invention, a method of forming low dielectric constant, low leakage current with high Elastic modulus and Hardness silicon carbide film for use in integrated circuit fabrication processes is provided. The silicon carbide film is deposited on a substrate by introducing alkyl silicon compounds such as divinyl-dimethylsilane (Si(CH=CH$_2$)$_2$(CH$_3$)$_2$), tri-methylsilane (SiH(CH$_3$)$_3$) or tetra-methylsilane (Si(CH$_3$)$_4$) referred to herein as TMS, a substantial source of oxygen such as oxygen (O2) or carbon dioxide (CO2) and an inert gas such as argon (Ar), helium (He), krypton (Kr), neon (Ne) or xenon (Xe) in the presence of an electric field in a plasma CVD reactor.

A mixture of high and low frequency RF power, such that high frequency RF power is in the range of 13.56 MHz to 30 MHz and low frequency RF power is in the range of 200 kHz to 500 kHz, wherein the ratio of low frequency to total power is less than about 0.5, generates the electric field. The leakage current and dielectric constant of the silicon carbide in this invention is decreased by introducing excess amount of oxygen and inert gas.

BRIEF DESCRIPTION OF THE DRAWINGS

FIG. 3 illustrates an exemplary sequence (deposition recipe) for forming a SiCO film.

DETAILED DESCRIPTION OF THE PREFERRED EMBODIMENT

Disclosed herein is a method for depositing a silicon carbide film having a low dielectric constant, low leakage current, high elastic modulus and high hardness onto a substrate in a CVD chamber, comprising the steps of providing a silicon source, carbon source, oxygen source and an inert gas in a reaction zone containing a substrate, and reacting the silicon and carbon and oxygen source in the presence of a plasma to deposit a low dielectric constant and low leakage current silicon carbide film on the substrate.

A mixture of high and low frequency RF power generates the electric field, wherein the ratio of low frequency to total power is less than about 0.5. The leakage current and dielectric constant in the resulting silicon carbide film is directly related to the carbon concentration, amount of oxygen and inert gas introduced.

Silicon Carbide Layer Formation

In one preferred embodiment of the present invention, a silicon carbide layer is formed by reacting a gas mixture including, silicon source, carbon source, oxygen source and an inert gas into a plasma enhanced chemical vapor deposition (PECVD) chamber. Details of the processing system are illustrated in FIG. 1.

Figure 1:
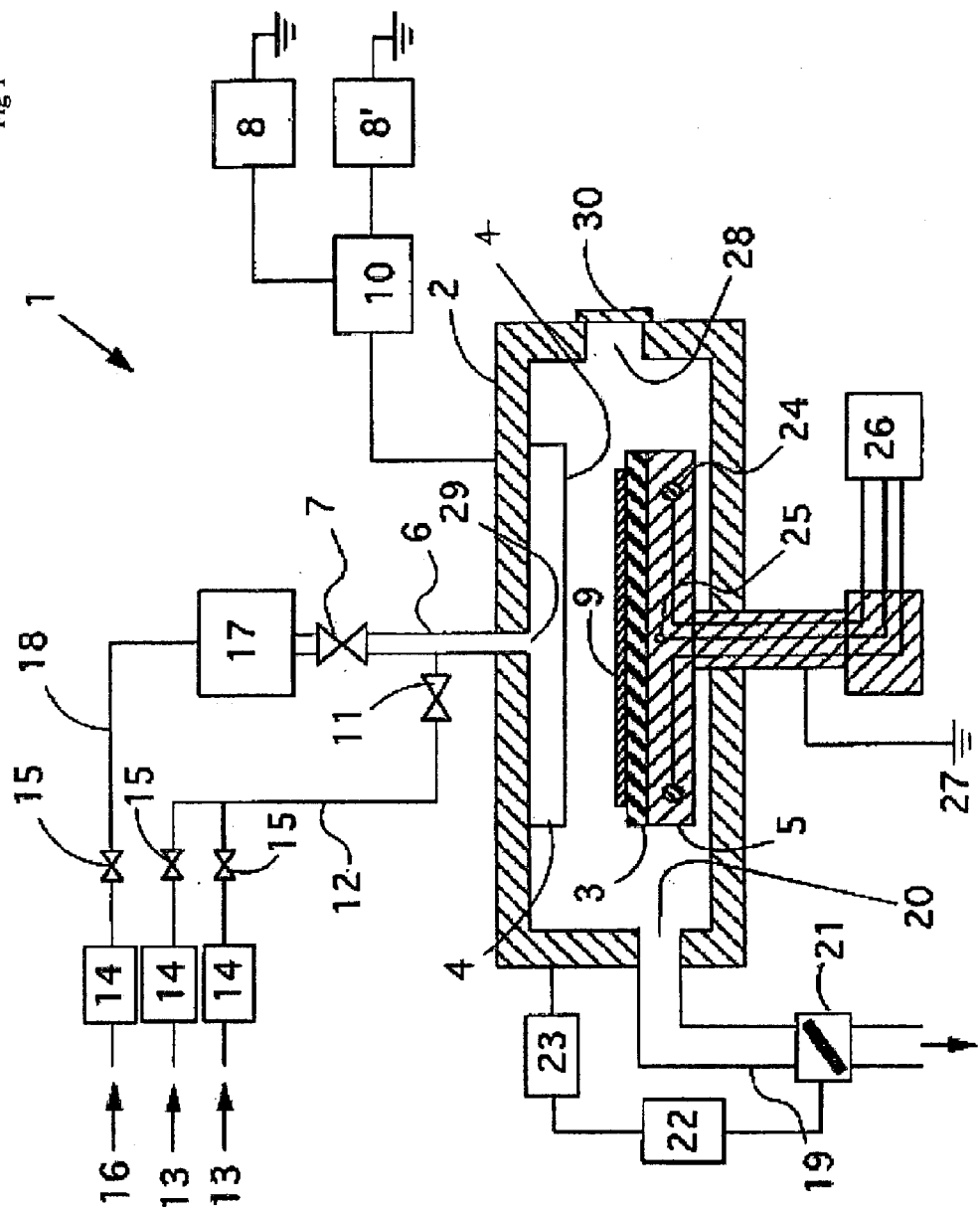
FIG. 1 is a schematic cross-sectional view of an exemplary plasma chemical vapor deposition device.

FIG. 1 is a schematic cross section of an exemplary plasma CVD device according to a preferred embodiment. A plasma CVD device 1, which is used to form a thin film on a semiconductor wafer 9 or other substrate, comprises a reaction chamber 2, a support 3 provided within the reaction chamber to support the semiconductor wafer 9, a showerhead 4 that is positioned to face the support 3 and is used to spray reaction gas uniformly onto the semiconductor wafer 9, an outlet 20 to exhaust reaction gases and byproducts from the reaction chamber 2, and a remote plasma chamber 17. Cleaning gas for the remote plasma chamber 17 is supplied through a conduit 18 having an inlet port 16 leading to a main flow controller 14 and a valve 15. The remote plasma discharge chamber 17 is linked to the showerhead 4 via piping 6 and valve 7. The remote plasma discharge chamber 17 generates active species using radio-frequency oscillating output energy of the designated frequency, and the piping 6 is made of materials that are not corroded by the active species.

The support 3 that is provided within the reaction chamber 2 and that is used to support the semiconductor wafer 9 is made of anodized aluminum alloy and is grounded 27 to constitute one side of an electrode of plasma discharge. The reaction chamber 2 of the illustrated embodiment is thus a plasma CVD chamber configured for in situ (in chamber) plasma generation. The support 3 includes a heater 5 having a ring-shape heating element 24 embedded therein. The semiconductor wafer's temperature is controlled at a predetermined temperature using a temperature controller (not shown). The support 3 is connected to a driving mechanism 26 that moves the support 3 up and down through a support piston 25.

Within the reaction chamber 2, the showerhead 4 is provided at a position facing the support 3. In the showerhead 4, thousands of fine holes are provided to inject reaction gas onto the semiconductor wafer 9. The showerhead is electrically connected to a radio-frequency oscillator 8 and 8' via matching circuit 10 and constitutes another electrode for plasma discharge. To bring reaction gas to be used for film formation from the showerhead 4, a reaction gas conduit 12 is connected to a mass flow controller 14 with a shut-off valve 15 near the outlet from the flow controller and a valve 11 controlling flow to the piping 6. The number of the gas conduits is not limited to one. According to the type of reaction gas, any number of gas conduits can be installed. One end of the gas conduit 12 constitutes a gas inlet port 13 to cause reaction gas to flow in and the other end constitutes a reaction gas exit port to cause gas to flow to the inlet 29 of the showerhead 4.

The outlet 20 is connected to a vacuum pump (not shown) through piping 19. Between the outlet 20 and the vacuum pump, a conductance-controlling valve 21 is provided to regulate pressure within the reaction chamber 2. The conductance-controlling valve 21 is electrically connected to an external regulator 22 and a pressure gauge 23, preferably provided to measure pressure within the reaction chamber 2. The wafer 9 is inserted into the chamber 2 through a port 28 controlled by a gate valve 30.

The silicon and carbon source may be an alkyl silicon compound having a general formula $Si_xC_yH_z$, where x has a range from 1 to 2, y has a range from 1 to 6, and z has a range from 6 to 20. For example, divinyl-dimethylsilane, tri-methylsilane, and tetra-methylsilane among others maybe used as the alkyl silicon compound. Oxygen source is oxygen (O2) and carbon dioxide (CO2). Helium (He), argon (Ar), neon (Ne), krypton (Kr) and xenon (Xe) maybe used for the inert gas.

In general, the deposition process parameters of forming a silicon carbide film on a 200 mm silicon wafer include a substrate temperature range of about 200° C. to about 400° C. (more preferably 300–350° C.), a chamber pressure of about 300 Pa to 1000 Pa, an alkyl silicon compound flow rate of about 100 sccm to 1000 sccm, oxygen source flow rate such as: oxygen (O2) of about 10 sccm to 500 sccm, and an inert gas flow rate of about 200 sccm to 5000 sccm. This creates a ratio of the inert gas flow rate to alkyl silicon compound is in the range of about 1:1 to about 1:10. The process also includes a mixed frequency RF power having at least a first RF power with a frequency in a range of about 13 MHz to 30 MHz (high frequency) with a power in a range of about 100 Watts to 2000 Watts; and at least a second RF power with a frequency in a range of about 100 kHz to 500 kHz (low frequency) with a power in the range of about 10 Watts to 500 Watts. Thus the ratio of low frequency to total power is less than about 0.5, and the RF power source generates the electric field. Preferably the first RF power is in the range of 100 to 1000 W and the second RF power is in the range of 10 to 250 W. The second RF power with a frequency in a range of 300 kHz to 450 kHz is preferably used in combination with the first RF power.

The ratio of the second RF power to the total mixed frequency power is preferably less than about 0.5 to 1.0. The above process parameters provide a deposition rate for the silicon carbide layer in the range of about 0.2 μm/min to 1 μm/min, when implemented on a 200 mm substrate in a deposition chamber.

The details on film forming steps and parameters are explained below.

Silicon Carbide Film Formation

As an exemplary process for growing silicon carbide film on a substrate according to the present invention, the parameters listed in TABLES 1 through 3 were used:

TABLE 1

| Parameter | Step 1 | Range Step 2 |
|---|---|---|
| Tetra-methylsilane (TMS) flow rate | 100 sccm~1000 sccm | 0 sccm~500 sccm |
| Helium (He) flow rate | 100 sccm~10000 sccm | 100 sccm~10000 sccm |
| Oxygen (O2) flow rate | 10 sccm~5000 sccm | 0 sccm~1000 sccm |
| Pressure | 300 Pa~1000 Pa | 300 Pa~1000 Pa |

TABLE 1-continued

| Parameter | Step 1 | Range Step 2 |
|---|---|---|
| Primary RF Power | 100W~2000W | 100W~2000W |
| Secondary RF Power | 10W~500W | 10W~500W |
| Substrate Temperature | 200° C.~400° C. | 200° C.~400° C. |

TABLE 2

| Parameter | Step 1 | Preferred Range Step 2 |
|---|---|---|
| Tetra-methylsilane (TMS) flow rate | 100 sccm~700 sccm | 0 sccm~300 sccm |
| Helium (He) flow rate | 100 sccm~3000 sccm | 100 sccm~5000 sccm |
| Oxygen (O2) flow rate | 20 sccm~1000 sccm | 0 sccm~500 sccm |
| Pressure | 300 Pa~1000 Pa | 300 Pa~1000 Pa |
| Primary RF Power | 100W~1000W | 100W~1000W |
| Secondary RF Power | 20W~300W | 20W~300W |
| Substrate Temperature | 250° C.~350° C. | 250° C.~350° C. |

TABLE 3

| Parameter | Step 1 | More Preferred Range Step 2 |
|---|---|---|
| Tetra-methylsilane (TMS) flow rate | 100 sccm~500 sccm | 0 sccm~100 sccm |
| Helium (He) flow rate | 100 sccm~1000 sccm | 100 sccm~2500 sccm |
| Oxygen (O2) flow rate | 20 sccm~500 sccm | 0 sccm~250 sccm |
| Pressure | 300 Pa~800 Pa | 300 Pa~800 Pa |
| Primary RF Power | 350W~500W | 350W~500W |
| Secondary RF Power | 50W~150W | 50W~150W |
| Substrate Temperature | 300° C.~350° C. | 300° C.~350° C. |

Silicon Carbide Film Forming Conditions/Sequence

To deposit silicon carbide layer on 200 mm wafer, a reactive gas source such as tetra-methylsilane (TMS) is introduced into the reaction zone. Oxygen is used as an oxygen source. Helium is used as an inert gas. See TABLES 1 through 3 for gas flow rates. The chamber is maintained preferably at about 300 to 1000 Pa, more preferably maintained at about 300 Pa to 800 Pa. A mixed frequency of 27.12 MHz and 400 kHz RF power source preferably delivers at least about 100 Watts to 2000 Watts and at least about 10 Watts to 500 Watts respectively. More preferably 27.12 MHz RF power of 400 W and 400 kHz RF power of 100 W is applied for forming films.

Silicon carbide film deposition steps are divided into 2 steps. First, basic film is formed on the substrate by flowing TMS, O2, He and applying RF power as shown in FIG. 3 (TMS=300 sccm; O2=100 sccm; He=400 sccm; 27.12 MHz at 400 W; 400 kHz at 100 W; substrate temperature=340° C.; chamber pressure=733 Pa).

Second, an active plasma treatment step is performed. After the basic film formation step, second film formation is carried out continuously. In this step, Helium flow is increased while TMS and O2 flow is decreased without changing plasma discharge. One has to consider that the film formation is continued during the active plasma treatment (TMS=Ramp down to 0 sccm; O2=Ramp down to 0 sccm; He=Ramp up to 2.5 slm; 27.12 MHz at 400 W; 400 kHz at 100 W; substrate temperature=340° C.; chamber pressure= 733 Pa).

The basic film properties of the silicon carbide film deposited using the above steps and conditions are shown in TABLE 4.

A silicon carbide film deposited by the basic film forming step alone is not stable, its film stress and dielectric constant changes when exposed to air at room temperature. This is due to the oxidation of the surface layer. The method of minimizing the oxidation of carbon containing films, such as SiC is published in United States Patent Application Publication 2002/054962; however, no changes/improvements to the film properties are observed. Furthermore, when annealing is performed at 400° C. under nitrogen atmosphere for 10 hours, a drastic change in the film stress is observed. The change in the stress is about 400 MPa, which consequently implies to a poor thermal stress stability behavior.

When an active plasma treatment in this invention is performed on the silicon carbide films, the unstable phenomena of the film stress and dielectric constant are solved. Also the dielectric constant and leakage current is decreased. Furthermore, after annealing at 400° C. under nitrogen atmosphere for 10 hours, almost no changes to the film properties are observed. It is presumed that the silicon carbide film deposited according to the embodiments described above has a good thermal stress behavior.

The silicon carbide films deposited by the PECVD process described herein have significantly lower dielectric constant and lower leakage current in comparison to the conventional silicon carbide films. Furthermore, the silicon carbide film deposited according to the as described above has a mechanical properties such as high elastic modulus and high hardness. The silicon carbide films can be deposited without a mixture of low and high frequency. However, the preferred mixture of high and low radio frequency corrects adverse film properties caused by the bombardment of the silicon carbide film with molecules of inert gas. Increasing the ratio of Si—C bonds in the film provides greater hardness and high elastic modulus in the silicon carbide film.

The following example illustrates a dual damascene structure in which a silicon carbide layer deposited according to the present invention can be used. FIGS. 2a–2j show a dual damascene structure in which a silicon carbide layer deposited according to the present invention can be used. A copper (Cu) layer (31) is first covered with a silicon carbide layer (32). Since the silicon carbide layer (32) according to this embodiment has low oxygen content with low leakage current, low dielectric constant with high elastic modulus and high hardness, it is suggested to be the most suitable material to use as a copper diffusion barrier layer. Before depositing the silicon carbide layer (32), the copper surface can be improved by removing any copper oxide that may be remaining on the surface. Typically a hydrogen ($H_2$) or an ammonia ($NH_3$) or methane ($CH_4$) plasma based reduction is used before the deposition of silicon carbide layer (32). This copper surface reduction to remove CMP residue can be performed in a PECVD chamber.

Figure 2A:
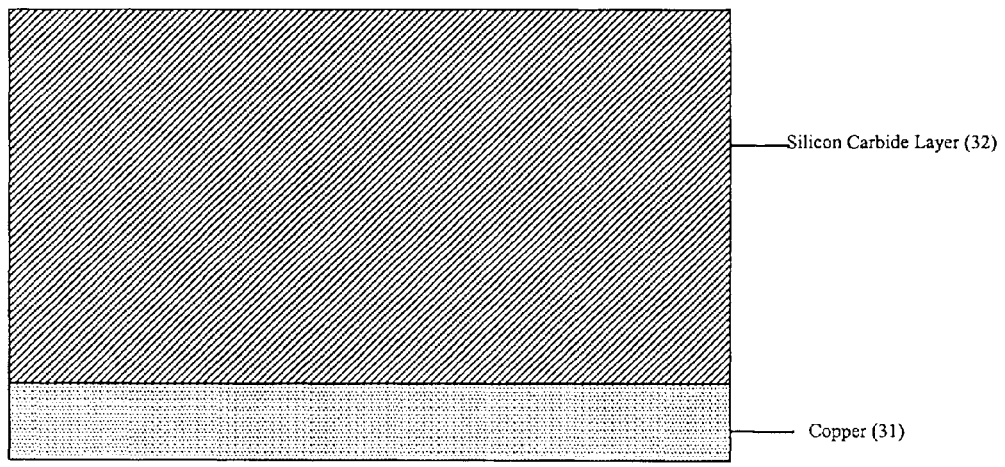
FIGS. 2a–2j illustrate a dual damascene structure in which a silicon carbide layer can be used.
Figure 2B:
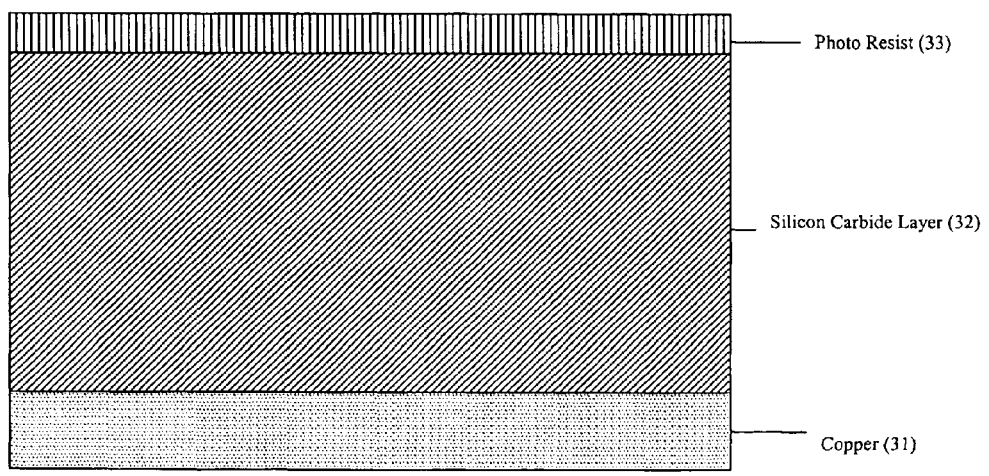
Figure 2C:
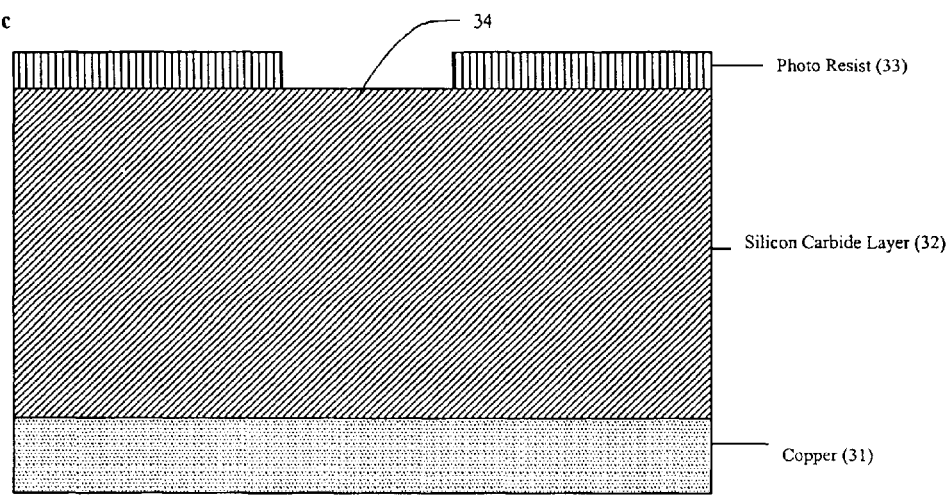
Figure 2D:
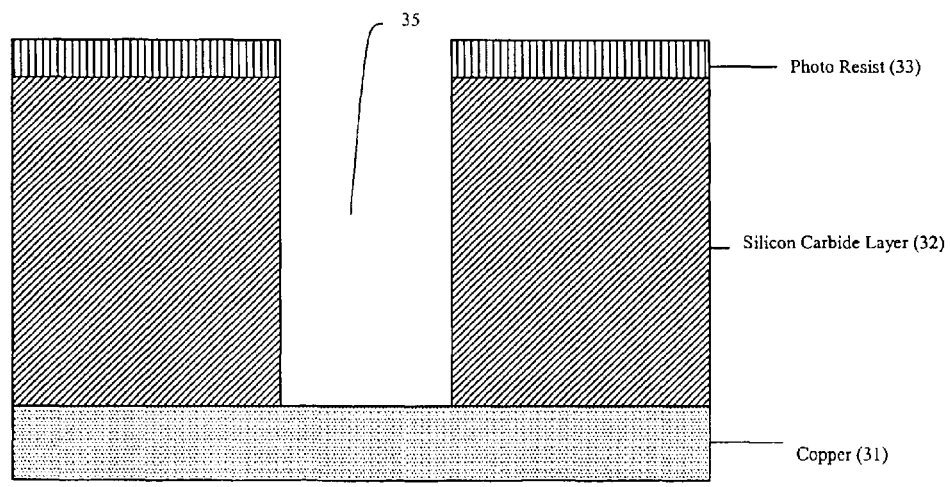

After the deposition of silicon carbide layer (32), a photo resist (33) is coated as shown in FIG. 2b. To form via holes and trenches, any suitable methods can be employed. The following is an example:

A via hole (35) is formed by etching. The process of forming a via hole is stated as follows: First a photo resist (33) is removed (34) as shown in FIG. 2c. Next, a via etching is commenced through the silicon carbide layer (32) as shown in FIG. 2d. Finally, The silicon carbide breakthrough step is performed to expose the underlying copper layer.

Figure 2E:
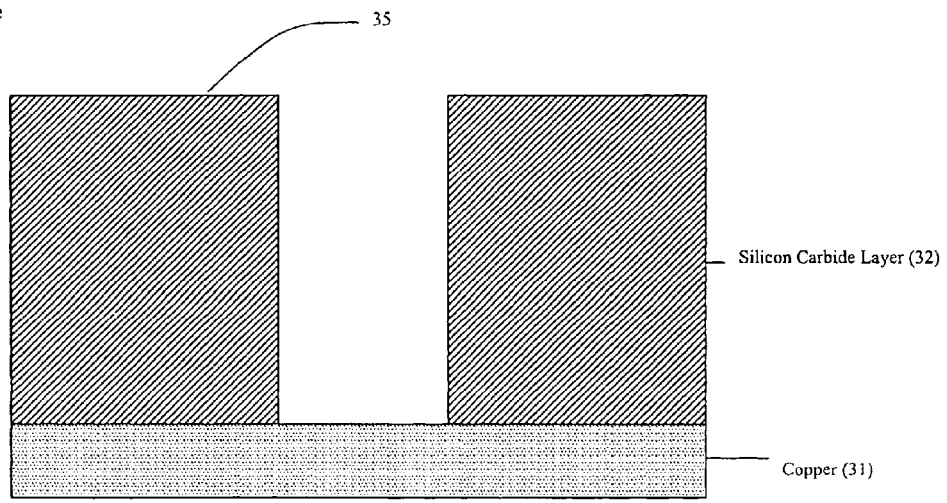
Figure 2F:
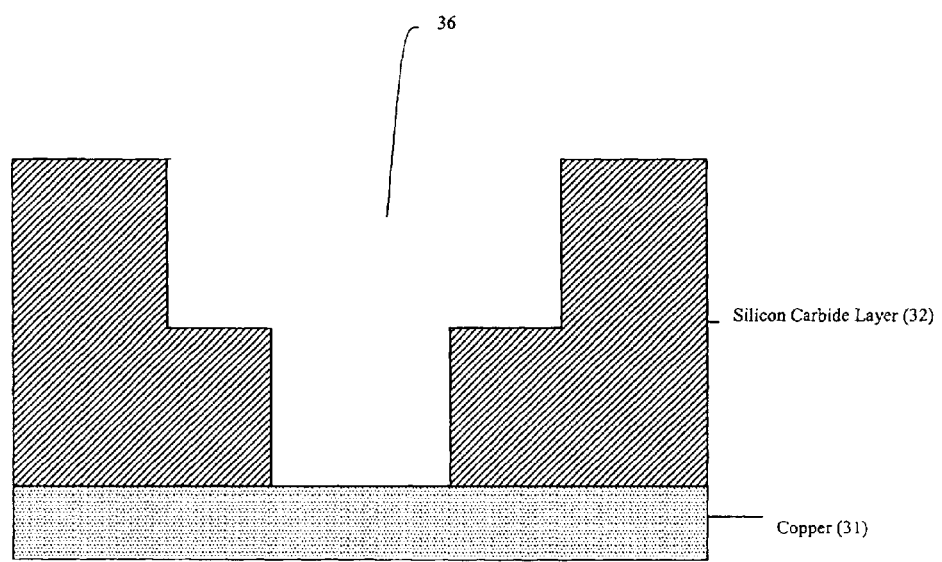

After via realization, trench patterning commences. After via etch and cleans are performed as shown in FIG. 2e, the wafer is coated with Sacrificial Light Absorbing Material (SLAM) and patterned with trench photo resist (not shown). Post trench etch, SLAM remains at the bottom of the vias and on top of the wafer (not shown). SLAM is removed from everywhere on the wafers with high selectivity to the silicon carbide during the trench etch clean step as shown in FIG. 2f.

Figure 2G:
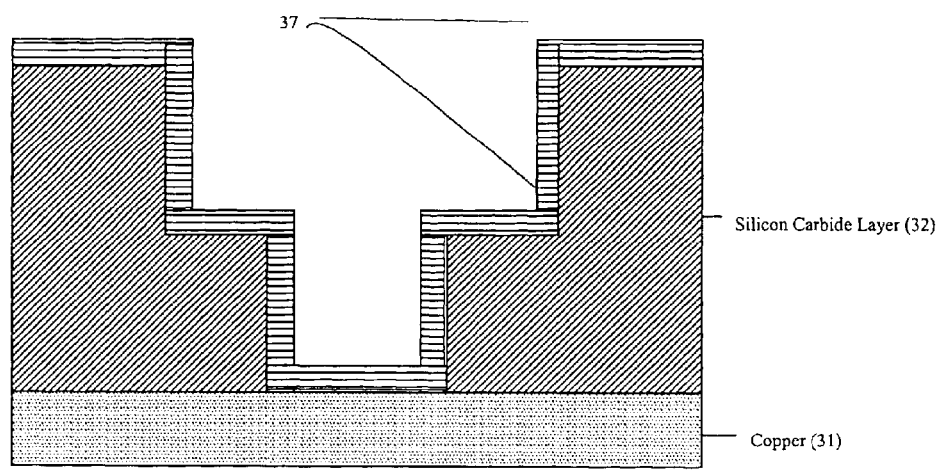
Figure 2H:
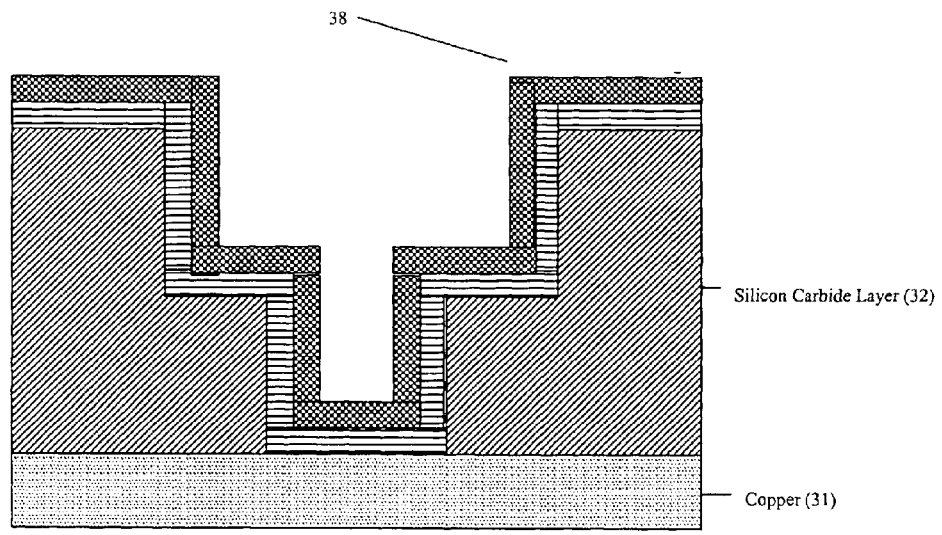
Figure 2I:
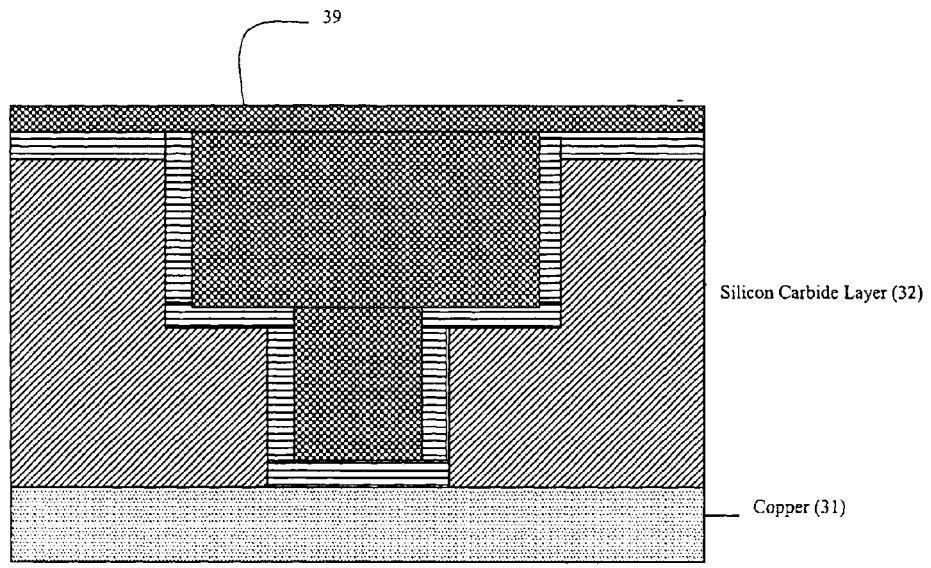
Figure 2J:
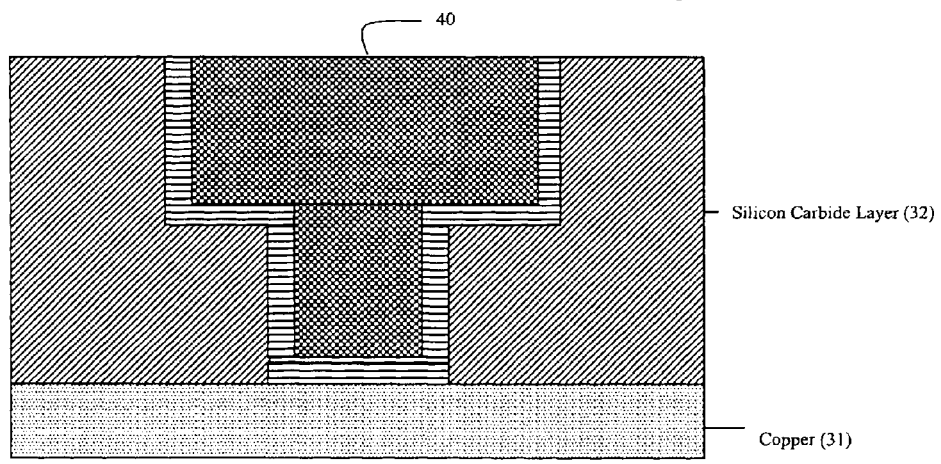

A copper barrier layer such as TaN or TiN (37), is formed inside the via hole as shown in FIG. 2g. A copper seed layer (38) is further deposited by PVD, or the like. Thereafter copper (39) is then deposited in the hole (36) by electric plating or the like. By CMP or the like, copper barrier layer (37), copper (38), resist (33), and sacrificial amount of silicon carbide layer are removed so that the surface (40) is exposed. A silicon carbide layer can also be deposited as a passivation layer (not shown) for protecting the device from scratching.

The dielectric constant and leakage current at 1 Mv/cm of conventional silicon carbide barrier layer is approximately 5 and $5 \times 10^{-7}$ $A/cm^2$ when compared to that of approximately 2.8 and $5 \times 10^{-10}$ $A/cm^2$ respectively in a silicon carbide barrier layer fabricated as described herein.

Furthermore, silicon carbide film according to the present invention is mechanically strong such as has high elastic modulus and hardness of approximately >10 G Pa and >2 G Pa respectively when compared to the other low-k films typically made of, for example inorganic materials such as fluorosilicate (FSG), hydrogen silsesquioxane (HSQ), methyl silsesquioxane (MSQ), and others like the same.

The advantage of the present invention is that this silicon carbide layer has improved electrical properties, including: (1) a higher breakdown voltage, (2) lower leakage currents, and (3) both greater film stability, and improved mechanical properties in terms of hardness. Moreover, the silicon carbide according to this present invention displays a dielectric constant that is less than 3.0, which improves the electrical performance of devices.

Thus, using a conventional silicon carbide barrier layer, as opposed to a silicon carbide layer fabricated as described herein, at an electric field of 2 MV/cm, maintains the same effectiveness in preventing the copper diffusion. Furthermore, the resulting silicon carbide layer has a relatively low dielectric constant, typically around less than 3.0, depending on the mixture and ratio of low frequency to the total frequency generated during deposition, and also depending on the ratio of gases used to form the silicon carbide.

The film formation was conducted according the deposition conditions shown in Table 4 below.

TABLE 4

| Parameter | Step1 | Step2 |
|---|---|---|
| Tetra-methylsilane (TMS) flow rate (sccm) | 300 | Ramp down to 0 sccm |
| Helium (He) flow rate (sccm) | 400 | Ramp up to 2500 sccm |
| Oxygen (O2) (sccm) | 100 | Ramp down to 0 sccm |
| Pressure (Pa) | 733 | 733 |
| Low RF Power (W) | 100 | 100 |
| High RF Power (W) | 400 | 400 |
| Substrate Temperature (° C.) | 340 | 340 |

An as-deposited silicon carbide layer has a dielectric constant and leakage current at 1 M/cm less than about 3.0 and $5 \times 10^{-10}$ $A/cm^2$, respectively, making it suitable for use as an insulating material in integrated circuits. The details of the film properties such as dielectric constant, leakage current and film stress of the silicon carbide layer deposited according to the deposition conditions shown in Table 5. The dielectric constant of the silicon carbide layer is tunable, in that it can be varied as a function of the ratio of the mixed frequency RF powers. In particular, as the ratio of the low frequency RF power to the total mixed powers decreases, the dielectric constant of the silicon carbide layer also decreases.

The dielectric constant of the silicon carbide layer can also be tuned as a function of the composition of the gas mixture during layer formation. As the carbon concentration in the gas mixture increases, the carbon content of the as-deposited silicon carbide layer increases, making the silicon carbide film less dense and dielectric constant decrease. Also, as the carbon concentration of the as deposited silicon carbide layer increases, the hydrophobic properties thereof increases making such layers suitable for use as moisture barriers in integrated circuits.

In addition, the as-deposited silicon carbide layer has low oxygen content. Thermal anneal test was used to check the barrier capability of the silicon carbide layer. Thermal penetration of the copper atom into the silicon carbide film was measured by secondary ion mass spectroscopy (SIMS). The copper penetration depth of the silicon carbide layer was less than 18 nm that indicates that the thermal diffusion of copper can be blocked effectively. It indicates that such a low oxygen content silicon carbide layer minimizes metal diffusion and improves the barrier layer properties. For example, the as-deposited silicon carbide layer has a current blocking ability at 1 MV/cm that is less than that about $1 \times 10^{-8}$ A/cm$^2$, which is suitable for minimizing cross-talk between integrated circuit interconnect structures.

TABLE 5

| Film type | Dielectric constant | Leakage current at 1 Mv/cm | Elastic Modulus | Hardness |
| --- | --- | --- | --- | --- |
| SiCO | 2.8 ± 0.1 | <5 × 10$^{-10}$ | 15G Pa | 2.2G Pa |

What is claimed is:

1. A method for depositing a silicon carbide layer onto a substrate, comprising:
    (a) providing a silicon source, carbon source, and oxygen source, and an inert gas into a reaction zone including the substrate;
    (b) applying low and high frequency RF energy to the reaction zone, thereby depositing a silicon carbide film on the substrate; and
    (c) continuously activating a plasma in the reaction zone by increasing flow of the inert gas while decreasing flow of the silicon source, carbon source, and oxygen source, while maintaining the RF energy, thereby reducing a dielectric constant of the silicon carbide film.

2. The method of claim 1, wherein:
    the high frequency RF power has a frequency between about 13 MHz and about 30 MHz, and has a power between about 200 watts and about 1000 watts; and
    the low frequency RF power has a frequency between about 100 kHz and about 500 kHz, and has a power between about 50 watts and 500 watts.

3. The method of claim 1, wherein a ratio of the low frequency RF power to a total RF power is less than about 0.5.

4. The method of claim 1, wherein the average power at the electrode surface is substantially constant.

5. The method of claim 1, wherein the silicon and carbon-source gas is one of the following: tri-methylsilane, tetra-methylsilane, or divinyl-dimethylsilane.

6. The method of claim 1, wherein the inert gas is one of the following: helium, argon or krypton.

7. The method of claim 1, wherein the oxygen source in either one of the following or both: Oxygen (O2) or Carbon dioxide (CO2).

8. The method of claim 1, wherein the ratio of the silicon and carbon source gas to the inert gas is between about 1:1 and about 1:15.

9. The method of claim 1, wherein the silicon and carbon source gas is provided into the reaction zone at a rate between about 200 sccm and about 500 sccm.

10. The method of claim 1, wherein the substrate is heated to a temperature between about 200° C. and about 400° C.

11. The method of claim 10, wherein the substrate is heated to a temperature between about 320° C. and about 350° C.

12. The method of claim 1, wherein the reaction zone is maintained at a pressure between about 300 Pa and about 1000 Pa.

13. The method of claim 1, wherein the reaction zone is maintained at a pressure between about 500 Pa and about 800 Pa.

14. The method of claim 1, wherein the silicon source and the carbon source are TMS, the oxygen source is O2, and the inert gas is He.

15. The method of claim 14, where the film formation is continued during the active plasma treatment step.

16. The method of claim 14, wherein the He flow during active plasma treatment steps is increased to a rate of about 1500 sccm to about 3000 sccm.

17. The method of claim 14, wherein the O2 during active plasma treatment step is decreased to a rate of about 50 sccm to 0 sccm.

18. The method of claim 14, wherein the TMS flow during active plasma treatment step is decreased to a rate of about 100 to 0 sccm.

19. The method of claim 14, wherein the He, TMS and O2 during active plasma treatment is increased, decreased and decreased respectively without changing the plasma discharge.

20. The method of claim 14, where a ratio of the low frequency RF power to the total RF power during active plasma treatment step is substantially the same as during the basic film forming step which is less than that of 0.5.

21. The method of claim 14, wherein the pressure during active plasma treatment step is substantially the same as that during the basic film forming step which is maintained at a pressure between about 500 Pa to about 800 Pa.

22. The method of claim 14, wherein the silicon carbide layer is oxygen-doped, and wherein the oxygen-doped silicon carbide layer has a dielectric constant less than about 3.0.

23. The method of claim 14, wherein the silicon carbide layer has a leakage current of less than $5 \times 10^{-10}$ A/cm2 at an electric field of 1 MV/cm.

24. The method of claim 14, wherein the silicon carbide layer is mechanically strong such as has high elastic modulus and hardness of approximately >10 G Pa and >2 G Pa respectively when compared to the other low-k films such as fluorosilicate (FSG), hydrogen silisesquioxane (HSQ), methyl silsesquioxane (MSQ), and others like the same.

25. The method of claim 14, where the silicon carbide layer has improved electrical properties by the active plasma step, including:

i) higher breakdown voltage, ii) lower leakage current, and iii) greater film stability.

26. The method of claim 14, wherein the silicon carbide layer minimizes metal diffusion and improves the barrier layer properties.

27. The method of claim 14, wherein the dielectric constant of the silicon carbide layer in tunable, in that it can be varied as a function of the ratio of the mixed frequency RF powers.

28. The method of claim 14, wherein the dielectric constant of the silicon carbide can be tuned as a function of the composition of the gas mixture during film formation.

29. The method according to claim 14, wherein the film is a copper diffusion barrier layer.

30. The method according to claim 14, wherein the film is a low-k film.

31. A method of manufacturing on a semiconductor substrate a structure containing a film in contact with a copper layer, comprising the steps of:

i) forming a silicon carbide layer on a semiconductor substrate by plasma reaction according to a method comprising:

(a) providing a silicon source, carbon source, and oxygen source, and an inert gas into a reaction zone including the substrate:

(b) applying low and high frequency RF energy to the reaction zone, thereby depositing a silicon carbide film on the substrate; and (c) continuously activating a plasma in the reaction zone by increasing flow of the inert gas while decreasing flow of the silicon source, carbon source, and oxygen source, while maintaining the RF energy, thereby reducing a dielectric constant of the silicon carbide film;

ii) forming a via in the silicon carbide layer to expose a portion of the copper layer;

iii) forming a trench in the silicon carbide layer above the via hole, the trench being used to accommodate a metal wiring;

iv) depositing copper in the hole; and v) removing the excess of the copper and resist on top of the silicon carbide layer.

32. The method according to claim 31, wherein in step (ii) the hole is produced by forming a resist on top of the silicon carbide layer and forming a via hole and trench by etching the silicon carbide layer using the resist, and in step (v) by CMP or the like, the resist and the excess copper are removed so that a surface is exposed.

33. The method according to claim 31, wherein steps (i) through (iv) are repeated at least once.

* * * * *